United States Patent
Giebel

[11] Patent Number: 6,111,291
[45] Date of Patent: Aug. 29, 2000

[54] MOS TRANSISTOR WITH HIGH VOLTAGE SUSTAINING CAPABILITY

[75] Inventor: Thomas Giebel, Dortmund, Germany

[73] Assignee: Elmos Semiconductor AG, Dortmund, Germany

[21] Appl. No.: 09/344,338

[22] Filed: Jun. 25, 1999

[30] Foreign Application Priority Data

Jun. 26, 1998 [DE] Germany ............... 198 28 520

[51] Int. Cl.$^7$ .................................................. H01L 29/76
[52] U.S. Cl. ..................... 257/339; 257/343; 257/389; 257/409
[58] Field of Search ................................. 257/389, 339, 257/331, 333, 336, 335, 343, 399, 409

[56] References Cited

U.S. PATENT DOCUMENTS

| | | | |
|---|---|---|---|
| 5,541,435 | 7/1996 | Beasom | 257/409 |
| 5,548,147 | 8/1996 | Mei | 257/333 |
| 5,977,590 | 11/1999 | Suzuki | 257/339 |
| 5,981,997 | 11/1999 | Kitamura | 257/335 |

FOREIGN PATENT DOCUMENTS 536227   9/1994   Germany .

*Primary Examiner*—Donald L. Monin, Jr.

[57] ABSTRACT

An ink replenishment kit and method for an inkjet printer includes a replaceable ink supply module providing replenishment of an inkjet printhead. The module includes a collapsible bag, an enclosure box, a connective tube, and an on/off valve. These four components are incorporated into a composite sealed system which remains intact during shipment, storage, installation and operation. A coupler is provided to securely attach a print cartridge inlet with the on/off valve to hold them together in an open position allowing ink to be replenished into the print cartridge from the collapsible bag.

4 Claims, 2 Drawing Sheets

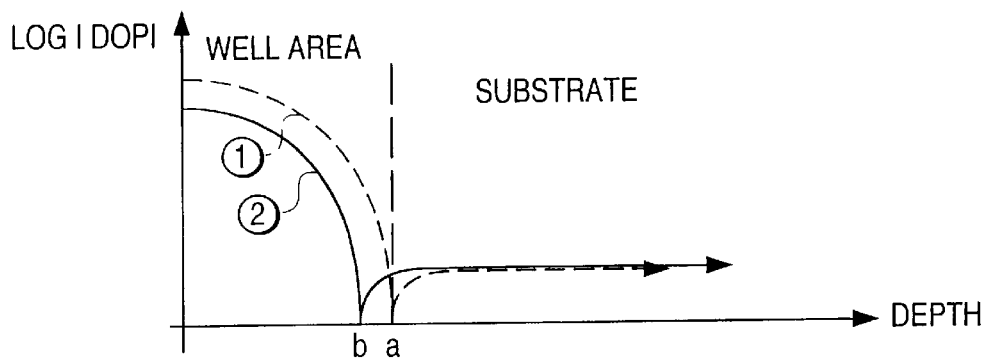
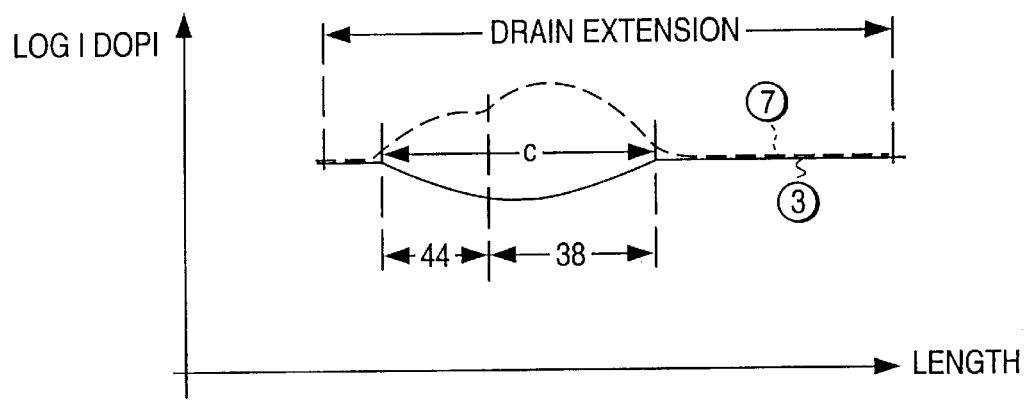
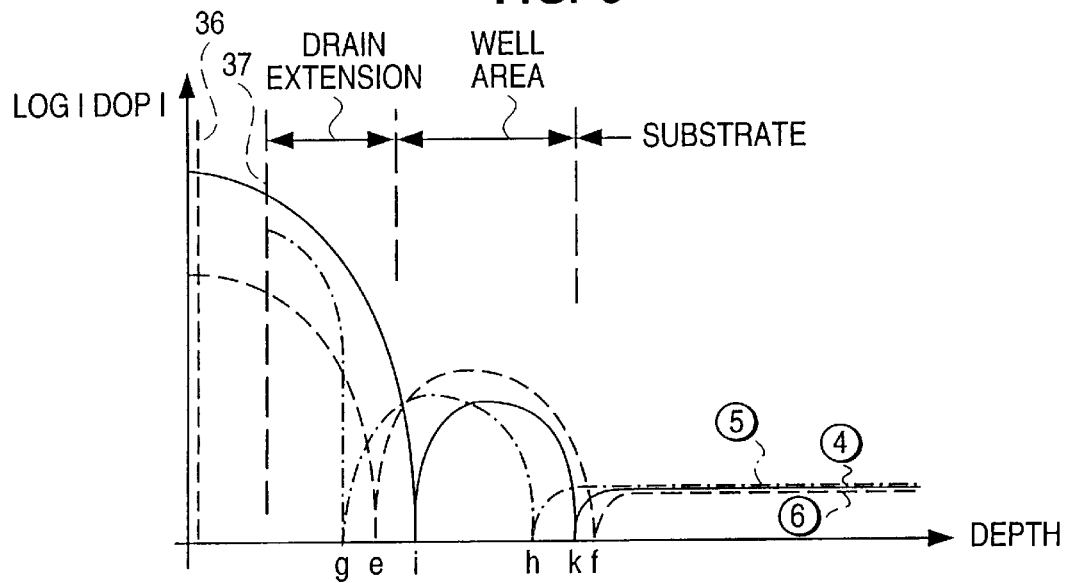

6,111,291

MOS TRANSISTOR WITH HIGH VOLTAGE SUSTAINING CAPABILITY

BACKGROUND OF THE INVENTION

The present invention relates to a MOS transistor with high voltage sustaining capability and low closing resistance. Particularly, the invention relates to a PMOS transitor having a high voltage sustaining capability with low closing resistance.

A high-voltage PMOS-transistor with a breakthrough voltage of about 44 V is disclosed in EP-A-91 911 911. Particularly in the automative region, however, increased demands are posed to the voltage sustaining capability. Thus, for instance, it is desirable that the PMOS transistor has a voltage sustaining capability of >60, preferably about 80 V, with the additional demand that the closing resistance of this transistor is relatively low.

For the voltage sustaining capability of MOS transistors, it is required that the electric field between the drain-side gate edge and the drain is decreased and the strength of the electric field on the drain-side gate edge is reduced. In principle, this can be achieved in that the drain is arranged at a distance from the drain-side gate edge, and in that a so-called drain extension region is arranged between the drain region and the gate, with the drain extension region having a lower concentration of charge carriers. The drain extension region is located around the drain region so that the latter is arranged within the former.

Such a drain extension region makes it possible, due to the relatively low concentration of charge carriers, to sufficiently decrease the electric field between the drain and the drain-side gate edge and to reduce the strength of the electric field on the gate edge to a sufficient extent. However, in such a transistor design, the closing resistance will increase. This closing resistance can be lowered if one succeeds in gradually increasing the charge carrier concentration in the drain extension region, i. e. starting from the drain-side gate edge up to the drain region. An example of such a MOS transistor with laterally modulated drain extension region is known from WO-A 97/13277. Said document discloses the lateral modulation of the doping material concentration in the drain extension region by insertion of an n-ion implantation while masking at least one distance region, wherein the implantation areas separated after ion implantation will "flow into each other" by subsequent thermally induced diffusion. In these regions, the doping material concentration will thus be reduced.

If, one the other hand, the generation of the drain extension region has to be performed while only one ion implantation without subsequent thermally induced diffusion is available, the measures indicated in the above mentioned PCT document are not suited to realize a lateral modulation in the ion-implanted drain extension region. As an alternative, the drain extension region could be generated by introducing a plurality of ion implantations with different energies. This, however, would require additional process steps with an inherent disadvantage.

It is an object of the invention to provide an MOS transistor with high voltage sustaining capability and low closing resistance, with the drain extension region of the transistor being ion-implanted, wherein the ion implantation step for generating the drain extension region shall remain unchanged.

SUMMARY OF THE INVENTION

To fulfill the above object, the present invention provides an MOS transistor with high voltage sustaining capability and low closing resistance comprising:

a substrate comprising a doping of a first conductive type, a well area formed in the substrate and provided with a doping of a second conductive type opposite to the first conductive type, source and drain regions of the first conductive type formed in the well area, a gate comprising a gate oxide layer and arranged between the source area and the drain region, the gate having drain-side end region arranged at a distance from the drain region and with a field oxide web being arranged below the drain-side end region of the gate, and a drain extension region comprising a doping of the first conductive type and having the drain region arranged therein, with the drain extension region reaching below the drain-side end region of the gate.

According to the instant invention, the above MOS transistor is characterized in that the drain extension region is formed by ion implantation and comprises a first partial area arranged below the field oxide web, and a second partial area joining the first partial area in the direction of the drain region and having at least a partial area of the drain region arranged therein or having the drain region bordering thereon, with the concentration of the electrically active doping of the first conductive type being smaller in the first partial area than in the second partial area of the drain extension region but larger than in the rest of the area of the drain extension region, and that the well area is formed by ion implantation of two partial areas spaced from each other by a distance region aligned with the the first and the second partial area of the drain extension region, and by subsequent thermally induced diffusion, wherein these two partial areas after diffusion are connected to each other within a connection region corresponding to the first and the second partial area of the drain extension region, and the concentration of the doping of the second conductive type is lower in this connection region than in the rest of the well area.

With regard to the MOS transistor of the invention a classical approach is made to increase the voltage sustaining capability, i. e. a field oxide web is arranged below the drain-side gate edge. Since the ion implantation for the drain extension region is introduced after configuration of this field oxid web, the drain extension region has a smaller depth below the field oxide web than in the rest of the region; for only the higher-energy portion of the ion implantation for the drain extension region is capable of penetrating the field oxide web. Thus a relatively narrow channel connection region froms below the field oxide web via which the entire current flowing from the gate to the drain is discharged. The special feature of the MOS transistor of the invention is that it has been succeeded in increasing the doping material concentration below the field oxide web and in the region between the field oxide web and the drain region within the drain extenion region without changing the ion implantation for generation of the drain extension region. In the case of the MOS transistor of the invention this is realised by a lateral modulation of the doping material concentration within the well area. For the MOS transisor of the invention this well area is generated by implantation of two partial areas which are spaced from each other by a distance region. The location of this distance region corresponds to that region in which the field oxide web and the distance region between field oxide web and drain area is arranged. After outdiffusion of the two ion-implanted partial areas of the well area, which are separated from each other, a continuous well area occurs whose doping material concentration is reduced in the connection region of the two partial areas with the connection region corresponding to the distance region. This reduction in doping material concentration entails an increased electrically activated doping concentration within the drain extension region when the ion implantation for the drain extension region has been introduced.

Due to the measures described above the MOS transistor of the invention comprises two partial areas with different doping material concentrations in the region of its drain extension region, which is arranged between the drain-side end region of the gate and the drain area. The first partial area is arranged below the field oxide web whereas the second partial area is arranged between said first partial area and the drain area or the drain area extends at least into said second partial area. In the first partial area the concentration of electrially active doping smaller than in the second partial area. The reason for this is that the first partial area is covered by the field oxide web during ion implantation for the drain extension region and thus in the first partial area only a smaller portion of ion implantation can be introduced than in the second partial area. However, the concentration of electrically active doping in the first partial area is larger than in the remaining drain extension region, except for the second partial area. The reason for this is that the doping material concentration of the well area in the region corresponding to the two partial areas of the drain extension region is reduced by masking (distance area). On the whole this results in a doping material concentration modulation both in vertial and lateral direction within the two partial areas of the drain extension region. In particualar below the field oxide web a region of the drain extension region is generated which possesses a higher concentration of electrically active doping which has a positive effect on the closing resistance of the MOS transistor. Further, it is of advantage to the closing resistance that the second partial area of the drain extension region adjacent to the field oxide web displays a concentration of electrically active doping further increased as compared with that of the first partial area.

Due to masking the well area a vertical and lateral modulation of the concentration of electrically active doping of the drain extension region is achieved for a MOS transistor with field oxide web below the drain-side end region of the gate, without the drain extension region having to be generated by means of an ion implanation comprising locally different energies. The drain extension area can rather be configured with the aid of an ion implantation remaining constant over its overall surface. Thus the production process need not be modified as far as the drain extension ion implantation is concerned. Merely masking of the well area is required during introduction of the ion implantation, which, however, has no effect on the production process.

As already said above, the classical approach to increase the voltage sustaining capability is applied to the MOS transistor of the invention, according to which besides a drift interval (drain extension) also a field plate in the drain-side end region of the gate is provided for equalization of the electrical field.

In the case of the implanted drift interval or drain extension after the field oxidation as provided by the invention this is twice as problematic: On the one hand the channel must be reliably connected without the doping material concentration in this region becoming too large, on the other hand the doping material concentration below the field oxide of the field plate will be relatively low and thus the ON-resistance relatively high.

Tests carried out in this connection have shown that the channel connection is uncritical with regard to the process technology. It is even possible to achieve an increase in the breakdown voltage by some volts when the implantation extends into the channel in particular by 0.5 to 1 $\mu$m. The reason for this is that the electrical field of the pn transistion between drain extension and well is not allowed to coincide with the still existing field peak at the start of the field plate.

The problem regarding the high-resistive drift interval below the field oxide is more difficult to solve. Tests carried out to compensate for the losses in the ON-resistance by shortening the drift interval between the field oxide web and the p+-drain region did not yield any success. On the whole it has so far been possible to increase the breakthrough voltage of these transistors up to almost 90 V with an increase of the ON resistance of 30–50% having been reached as compared with the presently used HVPMOS transistors.

An important improvement is achieved by the aforementioned idea to produce a well region by masking implanted partial areas and subsequent connection by diffusion of these partial areas. If the well implantation, as described here by means of a PMOS transistor in an n-wells is masked cut in the area of the field oxide web, the phosphorus concentration decreases in this area following the after-diffusion and field oxidation. This is all the more true as in this area the phosphorus concentration is particularly high due to the segregation. A low phosphorus concentration means at the same time a high electrically active boron concentration and thus higher conductivity. Simulations in this respect have shown that the boron concentration and thus the current flowing through the transistor nay be increased by up to 50%. However, it should not be held back that thus the boron concentration in the overlapping region between channel and drain extension rises and therefore the breakthrough voltage decreases by 10–20%. This is tolerable at a maximum breakthrough voltage of 90 V and an envisaged breakthrough voltage of 60 V.

For the new PMOS transistor a one-piece or two-piece p-doping implantation of a LOCOS process is used as drain extension, which, however, should not be employed unconsidered due to the excessively steep profile., The distictive maximum in this profile causes a field strength peak at the drain-side gate edge, which leads to premature breakthrough of the conventional HV-PMOS. To reduce the problem regarding this field strength peak the classical approach of using a field plate is selected: In the area of the drain-side gate edge a field oxide web is produced so that the drain-side gate edge is located in the middle of this web. Thus the field strength peak lies in the field oxide and has no influence on the silicon. However, since the p-doping implantation can be effected only after the field oxidation, a problem is encountered: Only a high-energy p-doping implanatation can penetrate the field oxide and thus produces only a thin p-conducting layer in the silicon. For this reason reliable channel connection is endangered and the complete structure displays a relatively high resistance.

The duct connection is ensured by the p-doping implantation extending into the channel area. This overlapping should amount to at least 0.5 $\mu$m to about 1 $\mu$m in order to guarantee that the pn-transition between implantation region and well displays an adequate distance to the active region edge of the field oxide web. Otherwise a critical field strength peak will occur again at this edge.

To reduce the ON resistance the field oxide web should be as narrow as technically possible to keep this high-resistive part of the drift interval as short as possible. In this connection it must be taken into consideration that in this way the field oxide thickness is also reduced which, in turn, leads to an increas in the field strength.

It would be better to increase the electrically active boron concentration in this area without, however, the energy or the dose of the p-doping implantation being allowed to be changed and without an additonal diffusion step being allowed to be introduced.

However, since in this area the electrically active doping is determined by two doping materials, boron and phosphorus, there is the possibility of increasing the electrically active boron concentration by decreasing the phosphorus concentration. For this purpose the well implantation in the area of the field oxide web is masked out. By after-diffusion the two well parts are reconnected by diffusion and a lower phosphorus concentration is thus achieved in this area. Advantageously the excess in the phosphorus concentration below the field oxide is no longer as high as previously due to segregation. For this reason the electrically active doping and thus the conductivity of the drift interval below the field oxide rises in the subsequent boron implantation by that amount by which the phosphorus concentration has been decreased, i. e. about 30–50%.

Finally it must be ensured that the p+-drain implantation must display a distance to both active region edges to avoid field strength peaks at these edges.

The sequence of a process for production of a transistor according to the invention configured as PMOS transistor comprises, for example:

Starting material p-silicon Epi

Well implantation using phosphorus with well gap (distance between the two implanted well partial areas)

After-diffusion and field oxidation LOCOS (field oxide web)

In particular two-piece p-doping implantation (for the drift interval/drain extension)

At option threshold implantation PMOS with masking-out process at the later drain-side gate edge Polydeposition and gate structuring p+-implantation PMOS drain/source (at the drain side at a distance to gate and active area edge)

Intermediate oxide

Contact holes

Metallization

BRIEF DESCRIPTION OF THE DRAWINGS

Hereunder the invention is explained in detail on the basis of a PMOS transistor with reference to the drawings in which:

FIGS. 1 to 3 show cross-sections of the near-to-surface region of a p-substrate in different phases of the production process for a voltage-proof PMOS transistor with low closing resistance and FIGS. 4 to 6 show doping material concentration patterns at locations of the p-substate marked in FIGS. 2 and 3.

DETAILED DESCRIPTION OF A PREFERRED EMBODIMENT

Figure 1:
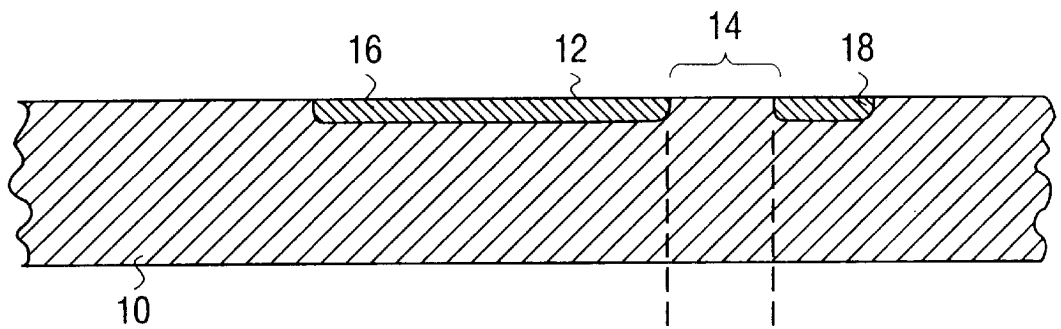
Figure 2:
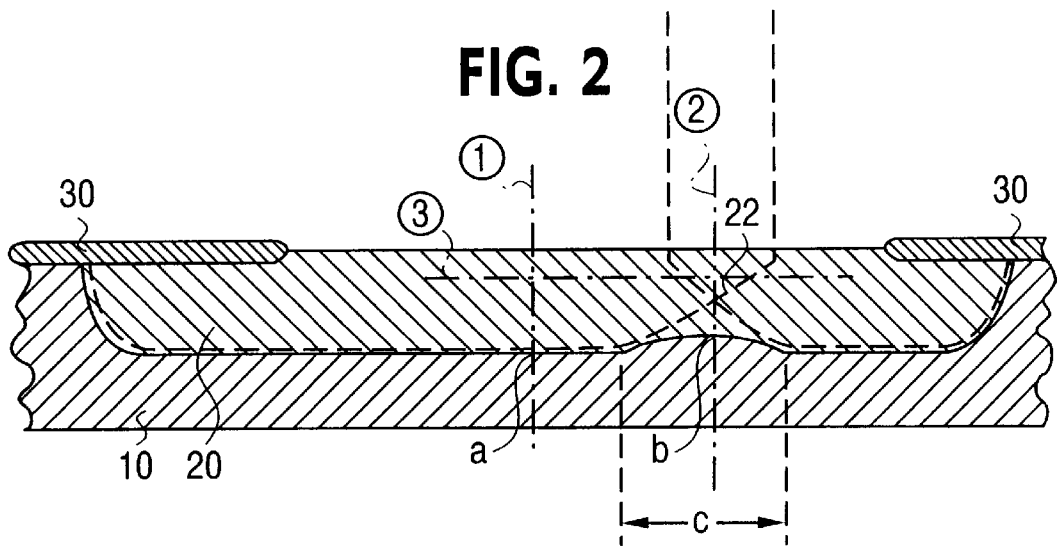

FIG. 1 shows a p-substrate 10 with two n-ion implantation areas 16, 18, spaced from each other by a distance region 14, introduced into the surface 12 of said areas. In the subsequent thermally induced diffusion, the two areas 16, 18 will flow together to form the n-well area 20 as shown in FIG. 2. In the connection region 22 corresponding to distance region 14, a reduced depth of n-well area 20 as well as a reduced phosphorus doping material concentration will be generated in the process. This is evident from the two curves in FIG. 4 and from curve 3 in FIG. 5. In FIG. 4, the doping material concentration profile resulting in the depth direction of n-well 20 outside connection region 22 is indicated by curve 1 as the amount of the doping material concentration. Starting from the doping material concentration on the surface 12 of p-substrate 10, the concentration decreases towards the bottom of n-well area 20 (p-n-transition a of FIG. 2) and then, with increasing progress into the depth of the p-substrate 10, takes on the doping material concentration of the latter.

The situation according to curve 2 of FIG. 4 is different. Starting from a doping material concentration value on substrate surface 12 which is below the value according to curve 1, the doping material concentration decreases towards the p-n-transition b located above p-n-transition a, and then, with increasing progress into the depth of the p-substrate 10, takes on the doping material concentration of the latter.

The situation in the lateral direction is shown by curve 3 in FIG. 5. In the connection region 22 and on both sides thereof (indicated by c in FIGS. 2 and 5), the resultant doping material concentration is lower than in the rest of the region of n-well area 20.

Figure 3:
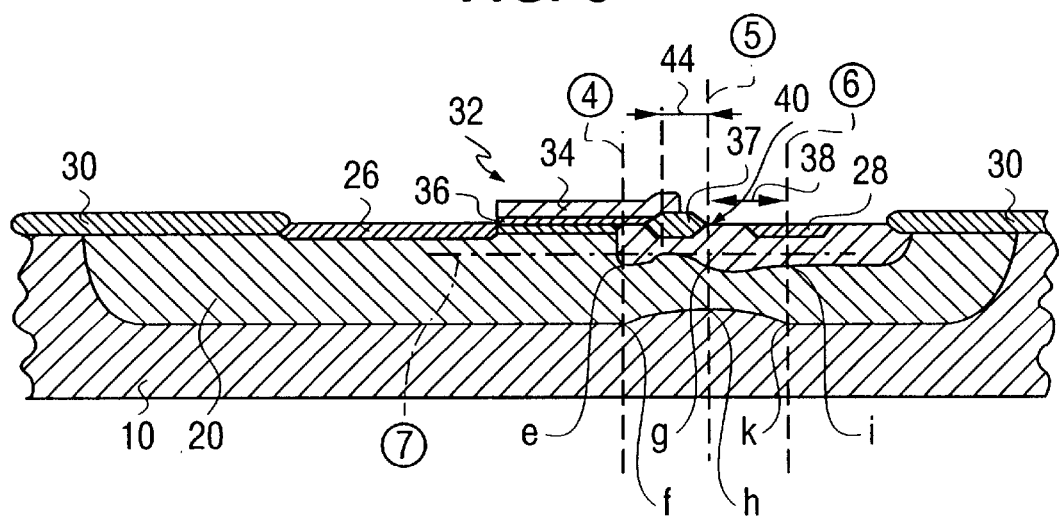

FIG. 3 shows the situation after introduction of the drain extension region 24 and configuration of the source area 26 as well as the drain area 28 arranged within the drain extension region 24. At the time of introduction of the ion implantation for the drain extension region 24, the field oxide 30 and the gate oxide 36 with field plate 37 of the gate 32 have already been configured. The configuration of this oxide layers takes place at the same time as the thermally induced diffusion of the well area 20. The gate electrode 34 shown in FIG. 3 is not yet configured at this time, but it is shown in FIG. 3 for the sake of completeness.

As shown in FIG. 3, the two partial areas 38 and 44 correspond to the region c of the well area 20 within the drain extension region 24. The partial area 38 is spaced from the drain-side gate edge 42 by distance 40 with the field plate 37 being arranged below the gate edge 42 and the field plate 37 extending on both sides of this drain-side gate edge 42 both further below the gate 32 and towards the drain area 28. This partial area 44 in which the field oxide web 37 at least partially extends, displays a lower concentration of electrically more active doping (boron doping) in the drain extension region 24 than the other partial area 38 extending towards the drain area 28. The reason for this is that owing to the field oxide web 37 a smaller amount of doping materials are fed to the region 44 during the ion implantation of the drain extension region 24 than to the region 38 and that the region (c) of the well area 20 corresponding to the two partial areas 38 and 44 has a lower concentration of doping materials (in this case phosphorus concentration) due to the masking. Since, however, the phosphorus concentration in the region c of the well area 20 is on the whole lower than in the rest of the region of the well area 20 an increased concentration of electrically active doping materials occurs in the two partial areas 38 and 44 of the drain extension region as compared with the rest of the part of the drain extension region 24. This leads to an improved electrical conductivity in the region of the drain extension region 24 represented by the two partial areas 44 and 38 and arranged adjacent to the channel below the gate 32. This reduces the closing resistance of the PMOS transistor which possesses an increased voltage sustaining capability due to the field oxide web 37. The doping material concentration profile along the lines 4 to 7 of FIG. 3 are shown in FIGS. 5 and 6. The letters e to k mark the p-n-transitions between differently doped regions.

In addition a threshold voltage ion implantation may be introduced below the gate 32 in the substrate 10 in the case of the transistor according to FIG. 3. This implantation is appropriately masked in the transition region between the gate oxide layer 36 and the field oxide web 37. Said threshold voltage implantation serves for adjustment of the threshold voltage of the transistor and is appropriately also introduced in the rest of the exposed upper side of the drain extension area 24, i. e. in particular in the area 38, to ensure here increase of the conductivity.

What is claimed is:

1. A MOS transistor with high voltage sustaining capability and low closing resistance comprising:

a substrate comprising a doping of a first conductive type;

a well area formed in the substrate and provided with a doping of a second conductive type opposite to the first conductive;

source and drain areas of the first conductive type formed in the well area;

a gate comprising a gate oxide layer and arranged between the source area and the drain area, the gate having drain-side end region arranged at a distance from the drain area, and a field oxide web arranged below the drain-side end region of the gate; and a drain extension region comprising a doping of the first conductive type and having the drain area arranged therein, with the drain extension region reaching below the gate oxide layer of the gate;

wherein the drain extension region is formed by ion implantation and comprises a first partial area arranged below the field oxide web and a second partial area joining the first partial area in the direction of the drain area, and having at least a partial area of the drain area arranged therein or having the drain area bordering thereon, with the concentration of the electrically active doping of the first conductive type being smaller in the first partial area of the drain extension region than in the second partial area of the drain extension region, but larger than in the rest of the region of the drain extension region; and wherein the well area is formed by ion implantation of two partial areas spaced from each other by a distance region aligned with the first and the second partial area, and by subsequent thermally induced diffusion, wherein these two partial areas after diffusion are connected to each other within a connection region (c) corresponding to the first and the second partial area of the drain extension region, and the concentration of the doping of the second conductive type is lower in this connection region (c) than in the rest of the well area.

2. The MOS transistor according to claim 1, wherein a threshold voltage ion implantation is formed below the gate for setting the threshold voltage except for a transition region between the gate oxide layer and the field oxide web.

3. The MOS transistor according to claim 2, wherein the threshold voltage ion implantation is also introduced into the drain extension region.

4. The MOS transistor according to claim 1, wherein the doping of the first conductive type is a p-doping and the doping of the second conductive type is an n-doping.

* * * * *